(12) United States Patent
Fawcett

(10) Patent No.: US 7,768,275 B2
(45) Date of Patent: Aug. 3, 2010

(54) METHOD AND APPARATUS FOR CHARACTERISING A THREE PHASE TRANSFORMER USING A SINGLE PHASE POWER SUPPLY

(75) Inventor: Timothy J. Fawcett, East Staffs (GB)

(73) Assignee: Hubbell Incorporated, Orange, CT (US)

( * ) Notice: Subject to any disclaimer, the term of this patent is extended or adjusted under 35 U.S.C. 154(b) by 624 days.

(21) Appl. No.: 10/591,528

(22) PCT Filed: Mar. 3, 2005

(86) PCT No.: PCT/GB2005/000810

§ 371 (c)(1),
(2), (4) Date: Aug. 24, 2007

(87) PCT Pub. No.: WO2005/085885

PCT Pub. Date: Sep. 15, 2005

(65) Prior Publication Data

US 2008/0136426 A1    Jun. 12, 2008

(30) Foreign Application Priority Data

Mar. 4, 2004    (GB)    ................................ 0404918.5

(51) Int. Cl.
*G01V 3/00*    (2006.01)
*G01R 31/06*    (2006.01)

(52) U.S. Cl. .................... 324/726; 324/346; 324/547

(58) Field of Classification Search ................ 327/100; 324/726, 547, 346; 340/646

See application file for complete search history.

(56) References Cited

U.S. PATENT DOCUMENTS 3,823,369 A * 7/1974 Sinha .......................... 324/547

(Continued)

FOREIGN PATENT DOCUMENTS

EP    0 260 500    8/1988

(Continued)

OTHER PUBLICATIONS

AVO International Biddle Three-Phase TTR, XP-002330453, Bulletin-1 3PHASETTR 8/99.

(Continued)

*Primary Examiner*—Timothy J Dole
*Assistant Examiner*—Farhana Hoque
(74) *Attorney, Agent, or Firm*—Alfred N. Goodman; Mark S. Bicks; Stacey J. Longanecker

(57) ABSTRACT

A method and apparatus for characterizing a three phase transformer (3) using a single phase power supply (1). Pairs of input terminals (H0-H3) of the transformer are sequentially energized for each energization and the voltage between pairs of output terminals (x0-x3) of the transformer are measured. Measured voltages are processed in order to characterize the winding configuration of the transformer. Either simultaneously or subsequently the presence of neutrals on the primary and/or secondary side of the transformer are identified to enable the winding configuration to be further characterized. Subsequently any phase displacement of the transformer is determined. The apparatus comprises means (2) for selectively applying a single phase power supply (1) to pairs of terminals (H0-H3) on the transformer (3) and for measuring voltages between pairs of terminals (x0-x3) of the transformer and for measuring phase difference between the primary and secondary sides of the transformer all under automatic control of a control means (13) which includes a processing means to process measured voltages and phase differences in order to characterize the transformer.

17 Claims, 5 Drawing Sheets

U.S. PATENT DOCUMENTS

| | | | |
|---|---|---|---|
| 4,241,306 A | | 12/1980 | Bump |
| 4,595,988 A | * | 6/1986 | Chiffert et al. ................ 702/60 |
| 5,276,402 A | * | 1/1994 | Schucht ...................... 324/726 |
| 2003/0139891 A1 | | 7/2003 | Coffeen |

FOREIGN PATENT DOCUMENTS

| | | | | |
|---|---|---|---|---|
| EP | 0260500 A | * | 8/1988 | |
| WO | WO/03/054561 | | 7/2003 | |
| WO | WO 03/054561 | | 7/2003 | |

OTHER PUBLICATIONS

IEEE Standard Test Code for Liquid-Immersed Distribution, Power, and Regulating Transformers, XP-002330454, The Institute of Electrical and Electronics Engineers, Inc., 3 Park Avenue, New York, NY 10016-5997, USA, Copyright 1999, ISBN 0-7381-1789-7 SH94778, ISBN 0-7381-1790-0 SS 94778.

* cited by examiner

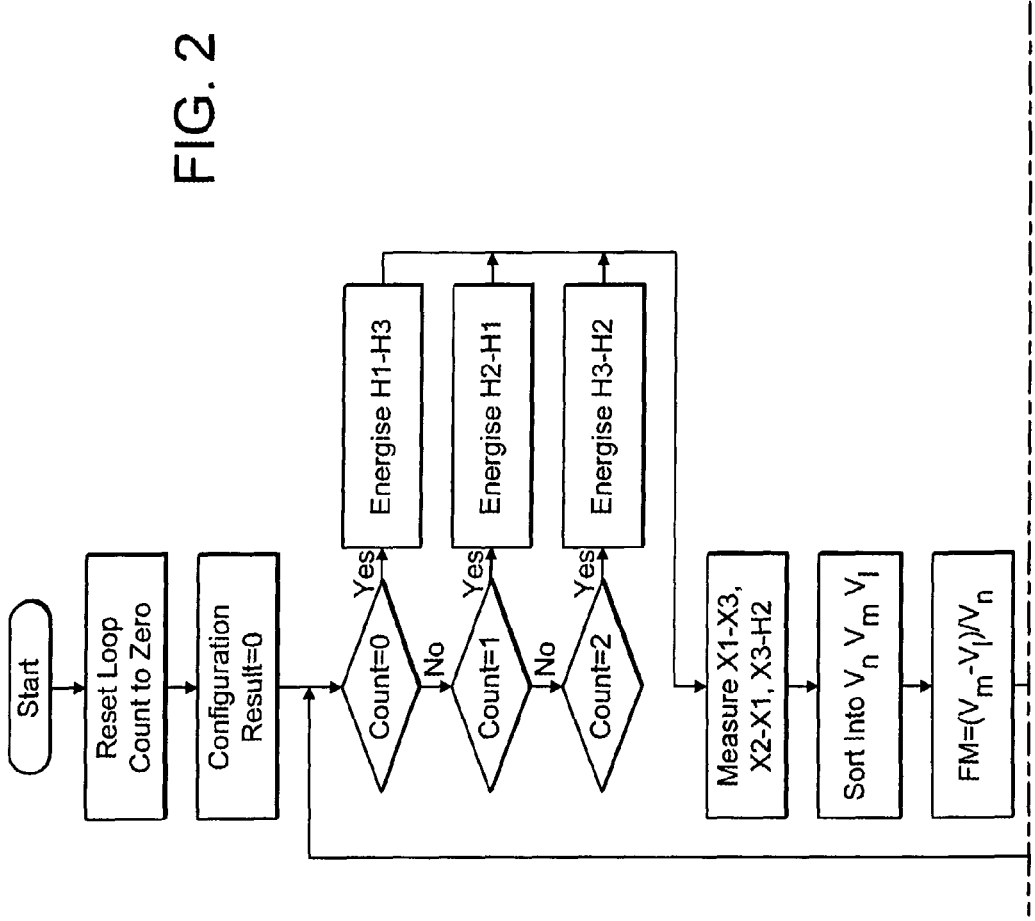

METHOD AND APPARATUS FOR CHARACTERISING A THREE PHASE TRANSFORMER USING A SINGLE PHASE POWER SUPPLY

The present invention relates to a method and apparatus for characterising a three phase transformer using a single phase power supply.

Three phase transformers are widely used in power supply and other applications. They typically comprise primary and secondary windings for each phase mounted on a three legged core.

The turns ratio of a transformer is the ratio of the number of turns of its primary winding divided by the number of turns of the secondary winding, for each leg of the transformer. The turns ratio is equivalent to the step up or step down voltage ratio of the transformer. By measuring the turns ratio of a transformer from its performance and comparing this with its rated voltage a good indication of the condition of the transformer can be obtained.

Transformers are routinely tested in this way throughout their life. Typically testing is carried out after manufacture to ensure that the transformer has been correctly wound, similarly after refurbishment or remanufacture, and as part of ongoing maintenance in order to detect any degradation in performance.

Probably the simplest way to measure the turns ratio of a three phase transformer, at least from the point of view of the apparatus required, is to use a single phase power supply to test the three pairs of primary and secondary windings individually. This approach is particularly desirable for field testing where providing a single phase power supply for testing is easier than providing a three phase supply. In fact provision of an appropriate three phase power supply may be impossible.

A drawback with use of a single phase supply to measure the turns ratio of a three phase transformer is that the way voltage should be applied to the transformer and the way it should be measured depends on characteristics of the transformer being tested, particularly its configuration and phase displacement, if any The primary and secondary windings of a three phase transformer can each be connected in one of five known configurations D (Delta), Y (Wye), Yn, Z (Zig Zag) and Zn.

In D configuration three windings are connected end to end in a loop and three external connections for the transformer are taken from between the windings. In Y configuration (also known as star configuration) one end of each winding are all connected together. The free ends of each winding form three external connections. In Yn configuration the connection between the three windings of a Y configuration is brought out as an additional neutral connection. Z configuration is electrically the same as Y, but each winding is distributed across more than one leg of the transformer to improve performance in the presence of an unbalanced load. Zn is a Z configuration with the connection between the windings brought out as neutral.

A three phase transformer can have a phase displacement. Shifting the secondary connections with respect to the primary connections, essentially re-labelling the connections, introduces a phase shift in 60 degree steps, as can reversing the windings. Configuration of the windings also affects phase. If configurations of the primary and second side are dissimilar an additional 30 degree shift is introduced. Phase displacement is usually classified using a number between 0 and 11 to indicate the number of 30 degree steps from in phase introduced by the transformer.

Before the turns ratio of a transformer can be properly measured using a single phase power supply it is necessary to know the winding configuration and any phase displacement of the transformer.

It is an object of the present invention to enable the windings configuration and/or phase displacement of a three phase transformer to be determined using a single phase power supply. It is a particular object to enable winding configuration and/or phase displacement to be automatically determined.

According to a first aspect of the present invention, there is provided a method of characterising a three phase transformer having three input terminals and three output terminals using a single phase power supply, the method comprising the steps of:

sequentially connecting the single phase power supply between all three available pairs of input terminals selected from the three input terminals of the transformer so as to energise each available pair of input terminals in turn;

during energisation of each pair of terminals measuring the voltage between all three available pairs of output terminals selected from the three output terminals of the transformer; and processing the measured voltages to characterise the transformer.

According to a second aspect of the present invention, there is provided apparatus for characterising a three phase transformer using the method of the first aspect of the present invention.

When characteristics of the transformer have been determined, it is possible for the turns ratio of the transformer to be measured using a single phase power supply.

Preferably, the method and apparatus enable a three phase transformer to be characterised according to its winding configuration. The method and apparatus may classify a three phase transformer as either D-D equivalent, D-Y equivalent, Y-D equivalent or Y-Y equivalent. The method and apparatus may further classify a transformer according to the presence of a neutral on either the primary or secondary side of the transformer, thereby to further characterise its winding configuration.

The method and apparatus also preferably enables the phase displacement of a transformer to be characterised.

The apparatus preferably comprises a single phase power supply and means for selectively applying power from the power supply to pairs of input terminals of a three phase transformer. Said means may comprise a switching matrix. The apparatus preferably further comprises means for measuring voltage between pairs of output terminals of a three phase transformer, which means may also include a switching matrix. The apparatus may further include a phase meter. The various components of the apparatus are preferably under the control of a control means which may comprise a programmed computer. The control means preferably includes a processing means for processing measured voltages in order to determine characteristics of the transformer. The apparatus may further include means for shorting any two terminals of a transformer together. Such means may comprise a shorting matrix.

The apparatus is preferably arranged to automatically characterise a transformer and provide results to a user. The apparatus may be further arranged to automatically test the turns ratio of a transformer using the single phase power supply, by the application of a known method.

The apparatus is preferably self contained and portable to facilitate in the field testing of transformers. The power supply of the apparatus may be provided by a local mains power supply.

In order that the invention may be more clearly understood an embodiment thereof will now be described, by way of example, with reference to the accompanying drawings of which:

Figure 1:
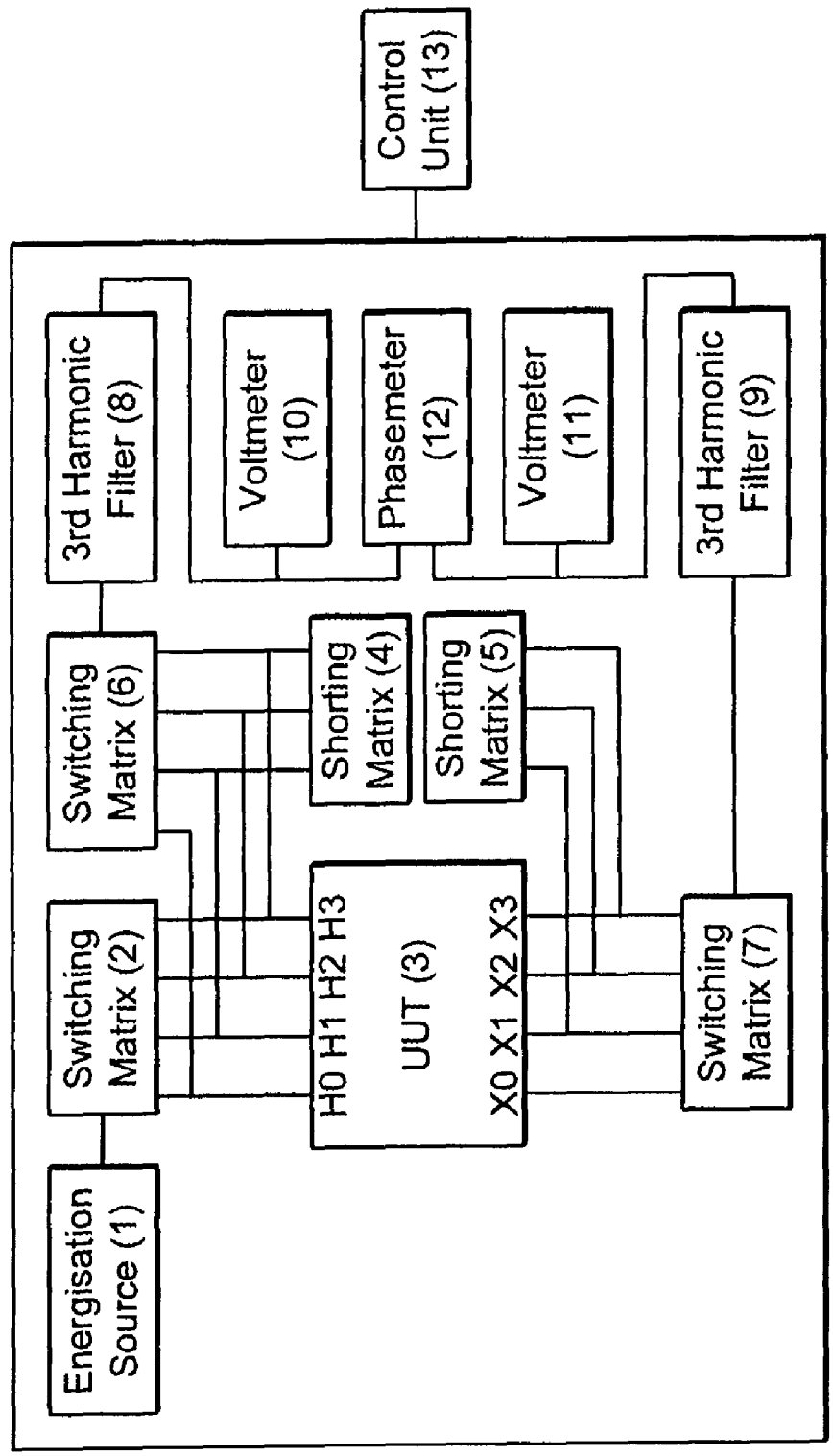
FIG. 1 is a schematic diagram of apparatus according to the invention.

An embodiment of the invention will be described with reference to a notional three phase transformer to be tested having input (primary) terminals H1, H2, H3 and optionally an input neutral terminal H0, and output (secondary) terminals X1, X2, X3 and optionally an output neutral terminal X0.

First the winding configuration of a transformer to be tested is determined.

Because the primary and secondary windings of a three phase transformer can each be wound in five ways there are a total of twenty five possible configurations for a transformer, as set out below, however it is unlikely to find all these configurations in practice.

| D-D | D-Y | D-Yn | D-Z | D-Zn |
|---|---|---|---|---|
| Y-D | Y-Y | Y-Yn | Y-Z | Y-Zn |
| Yn-D | Yn-Y | Yn-Yn | Yn-Z | Yn-Zn |
| Z-D | Z-Y | Z-Yn | Z-Z | Z-Zn |
| Zn-D | Zn-Y | Zn-Zn | Zn-Z | Zn-Zn |

Single-phase energisation of a transformer with a Z configuration produces the same results as a D configuration, so it is impossible to distinguish between the two. The use of Z windings on the primary of a transformer is unusual so these are treated as a special case. Because of the equivalent behaviour of Z and D windings, they are defined as similar, with Y windings being treated as different. This gives two groups of winding configurations:

D-Z-Zn; and

Y-Yn

This allows transformers to be grouped into four groups depending on the configuration of their primary and secondary windings, as set out below.

| Group 1 | D-D equivalent | D-D, D-Z, D-Zn, Z-D, Z-Z, Z-Zn, Zn-D, Zn-Z, Zn-Zn |
|---|---|---|
| Group 2 | D-Y equivalent | D-Y, D-Yn, Z-Y, Z-Yn, Zn-Y, Zn-Yn |
| Group 3 | Y-D equivalent | Y-D, Y-Z, Y-Zn, Yn-D, Yn-Z, Yn-Zn |
| Group 4 | Y-Y equivalent | Y-Y, Y-Yn, Yn-Y, Yn-Yn |

Energising a transformer input to input on the primary side and measuring the output to output voltages obtained on the secondary side allows a discrimination of the transformer's class to be made. The transformer is energised H1-H3, H2-H1 and H3-H2 and with each energisation the line-to-line voltages X1-X3, X2-X1 and X3-X2 are measured. Each set of three secondary measurements is normalised to the highest line-to-line voltage measured for that energisation. The theoretical results expected for transformers of each group identified above are as follows:

| Energise | Measure | Group 1 (D-D) | Group 2 (D-Y) | Group 3 (Y-D) | Group 4 (Y-Y) |
|---|---|---|---|---|---|
| H1-H3 | X1-X3 | 1 | 0.666 | 1 | 1 |
|  | X2-X1 | 0.85 | 1 | 0 | 0.5 |
|  | X3-X2 | 0.15 | 0.333 | 1 | 0.5 |
| H2-H1 | X1-X3 | 0.5 | 0 | 0.85 | 0.333 |
|  | X2-X1 | 1 | 1 | 1 | 1 |
|  | X3-X2 | 0.5 | 1 | 0.15 | 0.666 |
| H3-H2 | X1-X3 | 0.15 | 0.666 | 0.15 | 0.333 |
|  | X2-X1 | 0.85 | 0.333 | 1 | 0.666 |
|  | X3-X2 | 1 | 1 | 0.85 | 1 |

This shows that four response patterns can be expected to be observed, which can be classified as follows:

| Class | Response |
|---|---|
| A | 1:1:0 |
| B | 1:0.85:0.15 |
| C | 1:0.66:0.33 |
| D | 1:0.5:0.5 |

The responses of the four groups of transformers can be further classified according to the classes of response that they show thus:

| Group 1 (D-D) = | (2 * Class B) + (1 * Class D) |
|---|---|
| Group 2 (D-Y) = | (2 * Class C) + (1 * Class A) |
| Group 3 (Y-D) = | (2 * Class B) + (1 * Class A) |
| Group 4 (Y-Y) = | (2 * Class C) + (1 * Class D) |

So, by determining the class of response under each of the possible line-to-line energisations, it is possible to determine the group of the transformer under test. The expected voltage values shown above are theoretical ideal values and may not be seen in practice. Therefore to classify transformers in practice a range of values is substituted for each expected value and measured voltages are classified according to the range in which they fall.

Once the class of the transformer has been determined, it is necessary to determine if it has neutral connections. If there is no neutral connection, there is essentially a floating connection. The presence of a primary neutral can be determined by comparing the voltage produced on the secondary measuring output to output when the primary is energised input to input and input to neutral. If there is a significant difference recorded it indicates that the neutral line is floating (i.e. not connected). A similar process can be followed to determine the presence of a neutral on the secondary side. The transformer is energised input to input on the primary and the output to output and output to neutral voltages on the secondary are compared. Again if there is a significant difference, it indicates that the neutral line is floating (i.e. not connected).

When the group of transformer and the presence or absence of primary and secondary neutral connections is known, it is possible to determine the winding configuration:

| Transformer: | Prim. Neut. | Sec Neut. | Type |
|---|---|---|---|
| Group 1 | No | No | D-D (or D-Z or Z-D or Z-Z) |
|  | No | Yes | D-Zn |
|  | Yes | No | Zn-D (or Zn-Z) |
|  | Yes | Yes | Zn-Zn |
| Group 2 | No | No | D-Y (or Z-Y) |
|  | No | Yes | D-Yn (or Z-Yn) |
|  | Yes | No | Zn-Y |
|  | Yes | Yes | Zn-Yn |
| Group 3 | No | No | Y-D (or Y-Z) |
|  | No | Yes | Y-Zn |
|  | Yes | No | Yn-D (or Yn-Z) |
|  | Yes | Yes | Yn-Zn |
| Group 4 | No | No | Y-Y |
|  | No | Yes | Y-Yn |
|  | Yes | No | Yn-Y |
|  | Yes | Yes | Yn-Yn |

Once the configuration of a transformer has been determined, it is possible to determine its phase displacement. A three phase transformer core can be considered as having three legs A, B and C, each of which carries a primary and a secondary winding. If we regard the input to each primary winding as H1, H2 and H3 and the output of each secondary winding as X1, X2 and X3 the phase displacement is determined by which secondary outputs are on the same leg as which primary inputs. At this stage it can also be helpful to determine if any output terminals are swapped over with respect to the input terminals (e.g. X2 and X3 exchanged with respect to H2 and H3).

Determining which leg if a transformer is which depends on the class of the windings. The transformer is energised across one phase with the other input terminal shorted to the low end of the energising supply. This constrains the flux in the core of the transformer, and produces a minimum or a maximum on one of the output phases depending on the configuration of the transformer. By this process the phase shift, cause by rotation of the output terminals with respect to the input terminals, is determined. There are three possibilities: 0 (no phase shift), 4 (120 degrees) and 8 (240 degrees).

Transformers can be divided into two different classes for the determination of the phase shift. Phase shift Class 1 transformers have similar primary and secondary windings (i.e. Group 1 or Group 4 transformers) while Phase shift Class 2 transformers have dissimilar primary and secondary windings. This affects the way the transformer is treated to determine the winding configuration:

Phase Shift Class 1 Energise leg A, short leg C, minimum is measured on leg C

Phase Shift Class 2 Energise leg A, short leg C, maximum is measured on leg B

So for each group of transformers one can determine the phase shift due to the shifting of output terminals with respect to the input terminals (Note, "shifting" indicates output terminals swapped with respect to input terminals, that is that the X2 and X3 connections are reversed, essentially swapping the phase rotation from clockwise to anti-clockwise or vice versa.) The definition of which leg of the transformer is A, B or C depends on the configuration of the transformer and how we are energising it. If we define A as energisation H1-H3, then leg a=X1-X3, leg b=X2-X1, leg c=X3-X2

A' as energisation H2-H1, then leg a'=X2-X1, leg b'=X3-X2, leg c'=X1-X3

A" as energisation H3-H2, then leg a"=X3-X2, leg b"=X1-X3, leg c"=X2-X1

So, for the two phase shift classes of transformers the following will be observed.

Phase Shift Class 1 Transformers:

| Energise | Link | Minimum measured on Output Terminals: | | | | | |
|---|---|---|---|---|---|---|---|
| A | C (H3-H2) | c | b | a | c | a | b |
| A' | C' (H1-H3) | c' | b' | a' | b' | c' | a' |
| A" | C" (H2-H1) | c" | b" | a" | a" | b" | c" |
|  |  | Shift = 0 | Shift = 4 | Shift = 8 | Shift = 0 Swapped | Shift = 4 Swapped | Shift = 8 Swapped |

Phase Shift Class 2 Transformers:

| Energise | Link | Minimum measured on Output Terminals: | | | | | |
|---|---|---|---|---|---|---|---|
| A | C (H3-H2) | c | b | a | a | b | c |
| A' | C' (H1-H3) | c' | b' | a' | c' | a' | b' |
| A" | C" (H2-H1) | c" | b" | a" | b" | c" | a" |
|  |  | Shift = 0 | Shift = 4 | Shift = 8 | Shift = 0 Swapped | Shift = 4 Swapped | Shift = 8 Swapped |

By applying the appropriate energisation pattern, and looking for the maximum or minimum depending on whether the windings are dissimilar or similar, it is possible to determine the basic phase displacement of the transformer.

Once the phase shift has been determined, it is necessary to check for phase reversal, where the polarity of the secondary winding is reversed with respect to the primary winding, introducing a 180 degree phase shift onto the output. This is achieved by energising one leg of the transformer and looking at the corresponding secondary to see if the voltage is in phase with the energising voltage or 180 degrees out of phase. The phases to be energised and measured depend on the shift as determined previously:

| Determined Shift | Energise | Measure |
|---|---|---|
| 0 | H1-H3 | X1-X3 |
| 4 | H1-H3 | X3-X2 |
| 8 | H1-H3 | X2-X1 |
| 0 (Swapped Output) | H1-H3 | X1-X2 |
| 4 (Swapped Output) | H1-H3 | X2-X3 |
| 8 (Swapped Output) | H1-H3 | X3-X1 |

A figure from 0 to 11 for the phase displacement of the transformer is then calculated by taking the phase shift, if the windings are reversed adding 6 and if the transformer is Class 2 adding 1. If the result is greater than 11, 12 is subtracted.

FIG. 1 shows apparatus for automatically implementing the above method. Referring to FIG. 1 the apparatus comprises various electrical components and provides eight electrical test connections for connection to the terminals of a transformer to be tested 3. The apparatus comprises an energisation source 1 which provides a single phase electrical signal to a switching matrix 2. A switching matrix 2 is connected to each of the four test connections for connection to terminals H0-3 of a transformer under test 3. A second switching matrix 6 is also connected to each of the four connections and a shorting matrix 4 is connected to the connections intended for terminals H1-3 of a transformer under test 3. A third switching matrix 7 is connected to each of the four connections for connection to terminals X0-3 of a transformer under test 3 and a second shorting matrix 7 is connected the connections intended for terminals X1-3 of a transformer under test 3. The second 6 and third 7 switching matrices are connected via respective $3^{rd}$ harmonic filters 8, 9 to respective voltmeters 10, 11 and a single phasemeter 12

The various electrical components of the apparatus described above are all under control of a control unit 13.

The energisation source 1 comprises a single-phase transformer driven from the local mains electricity supply. However, alternative generation methods can be utilised. It is important that the energisation source provides a substantially sinusoidal signal as the presence of harmonics will disrupt measurement of the turns-ratio and compromise the accuracy of the system.

The first switching matrix 2 allows the output of the energisation source 1 to be applied, under the control of the control unit 13, across any two of the inputs H0-3 of the transformer under test 3.

The shorting matrix 4 is, in use, connected to H1, H2 and H3 of the transformer under test 3 and allows the apparatus to short any two of the primary terminals H1-3 together. This is required for phase displacement determination.

The second shorting matrix 5 allows any two of the secondary phase terminals X1, X2 and X3 of the transformer under test 3 to be shorted together. This feature is not utilised for the winding configuration and phase determination procedure, but is essential for subsequent turns-ratio measurement.

The second switching matrix 6 is operative to connect any of the primary connections of the transformer under test 3, H0-3 to the voltmeter 10 and phasemeter 12. It is operated in synchronisation with the switching matrix 2 by the control means 13 so that the primary voltage at the terminals of the transformer is measured while compensating for voltage drops in the measurement cables.

The third switching matrix 7 is operative to connect any two of the secondary terminals of the transformer under test 3, X0-3 to the voltmeter 11 and phasemeter 12. The third switching matrix 7 is operated by the control means 13 independently of the first and second switching matrices 2,6.

The two $3^{rd}$ harmonic filters 8 provide a notch response with a minimum at either 150 Hz or 180 Hz depending on the line frequency selected. They eliminate a third harmonic generated by the energisation source 1, or a transformer under test 3, that could otherwise affect measurement.

Voltages at the primary side of a transformer under test are measured by voltmeter 10 by measuring the peak-to-peak excursion of the primary waveform. The waveform is constantly sampled by an ADC (analogue to digital converter), and a digital peak detection system which returns the maximum and the minimum voltage recorded by the ADC. The difference between the two is used as a measure of the voltage. This automatically compensates for any DC offset on the measurement channel. Voltages at the secondary side of a transformer under test are measured by voltmeter 11 using the same technique.

The period of the voltage measured by voltmeter 10, the primary voltage, and the time displacement between primary voltage zero crossings and zero crossings of the voltage measured by voltmeter 11 (the secondary voltage) are measured by the phasemeter 12, to determine the phase relationship between the primary and secondary voltage to be measured by the apparatus.

The control means 13 comprises a software controlled computer, for example a PC, and is operative to control the various components of the apparatus in order to determine the configuration and phase displacement of a transformer under test 3. The control means 13 includes a processing means and a memory operative to store values relating to measured voltages, constants and to perform calculations and output results to a user in order to implement the algorithms described below. Any other appropriate type of control means could of course be employed.

Figure 2:
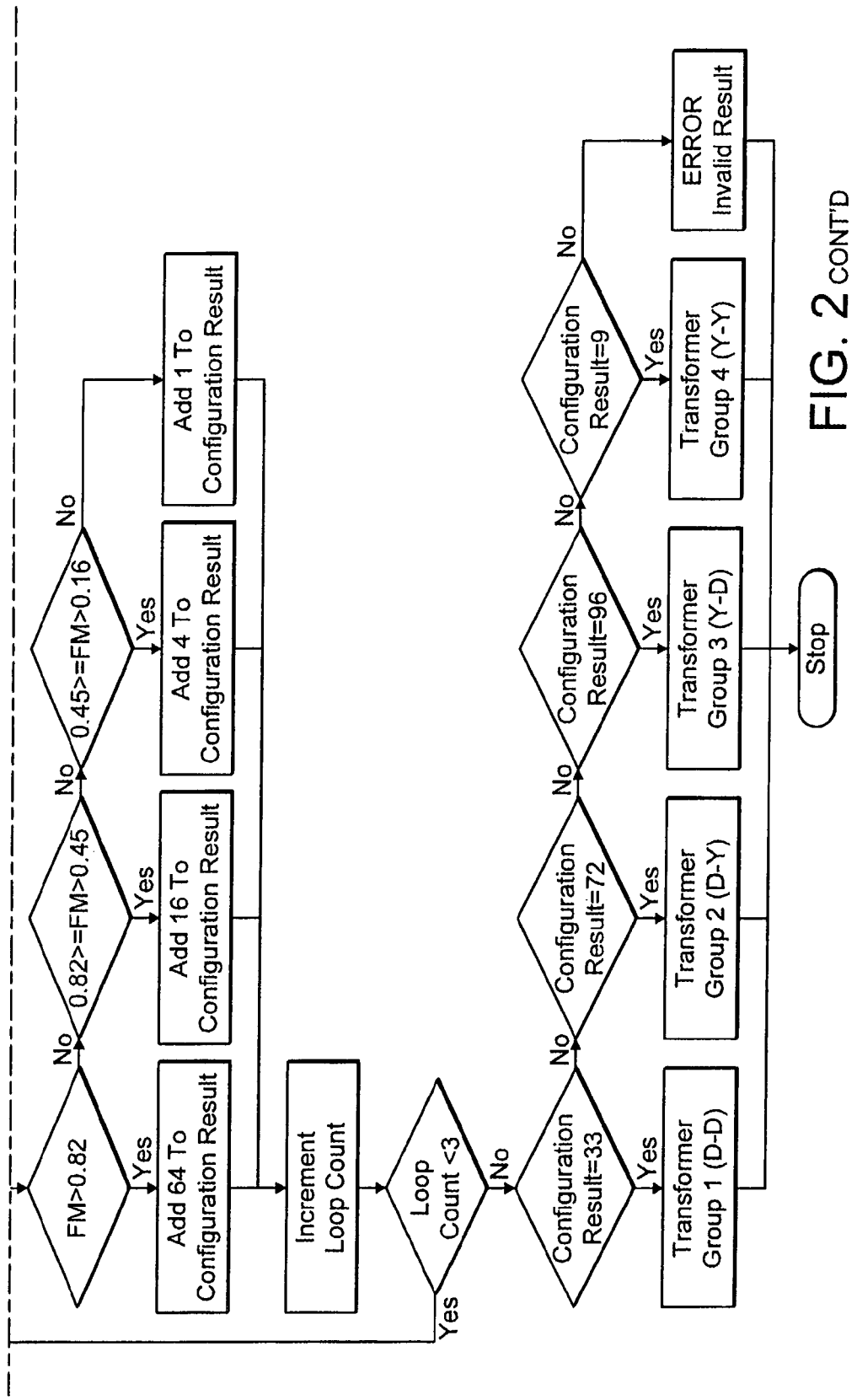
FIG. 2 is a flowchart illustrating operation of the apparatus of FIG. 1.
Figure 3:
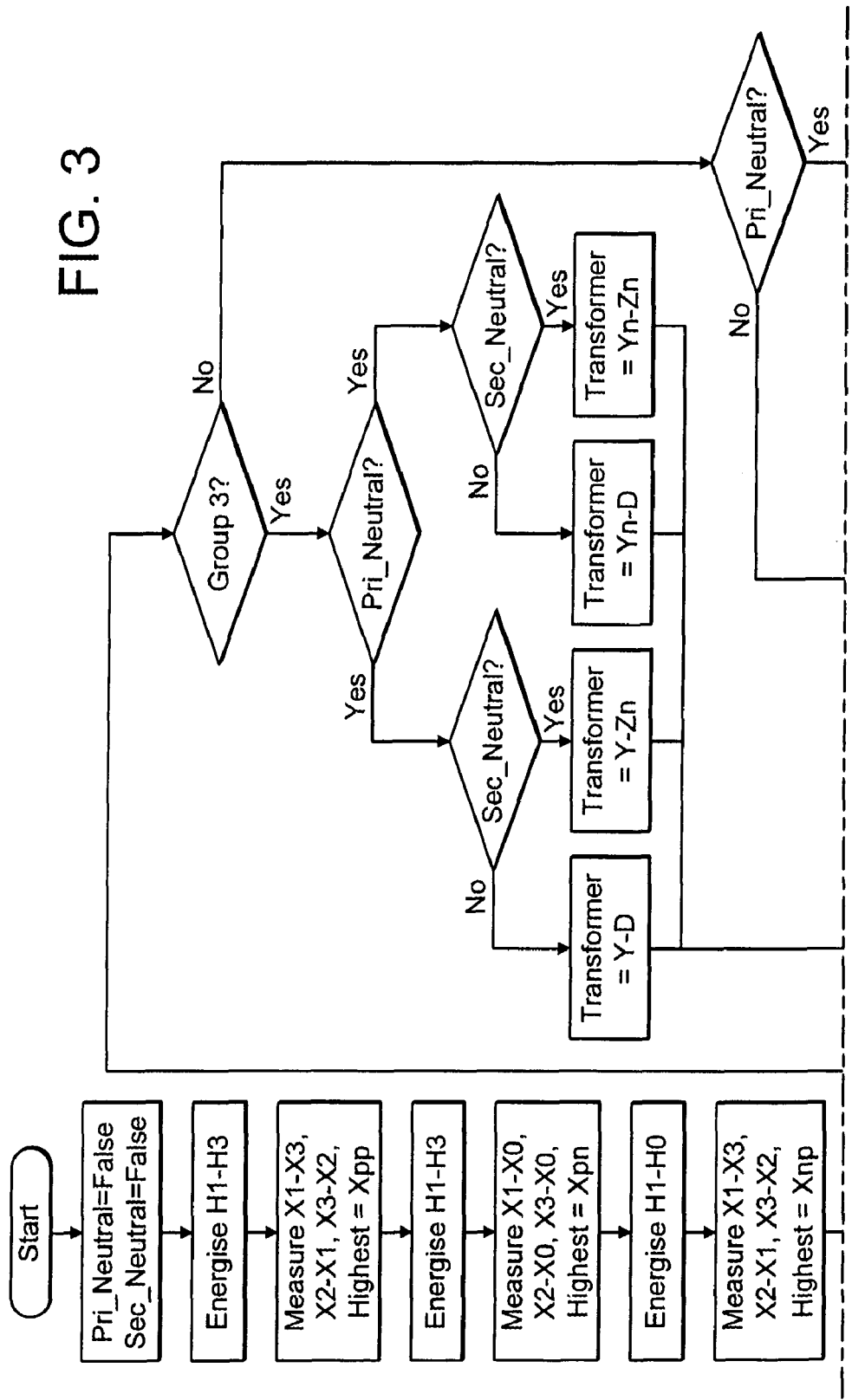
FIG. 3 is another flowchart illustrating further operation of the apparatus of FIG. 1.
Figure 3:
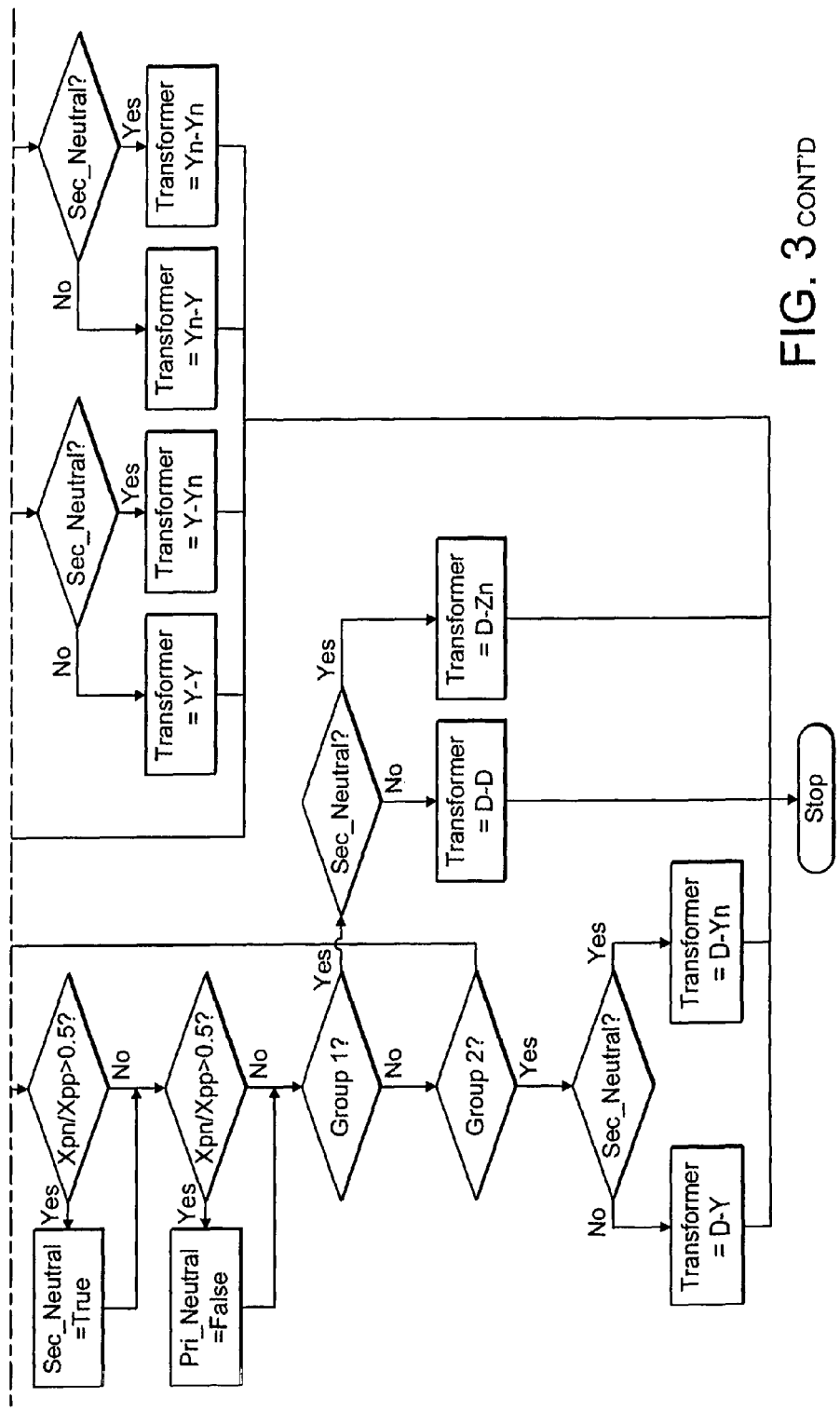

The software is first arranged to cause the apparatus to characterise the configuration of the transformer under test by employing an algorithm illustrated in FIG. 2, and then to further characterise the winding configuration and determine the phase displacement by employing the algorithm illustrated in FIG. 3.

Referring to FIG. 2 the first stage is energising the transformer input to input in each of the possible configurations (H1-H3, H2-H1 and H3-H2) and measuring the output to output voltages in each configuration (X1-X3, X2-X1, X3-X2). For each phase energisation, three measurements result, which must be classified to establish the configuration.

Classification is achieved by sorting the three measurements for each phase-to-phase energisation into order, so $V_h$ is the highest, $V_i$ is the intermediate value and $V_l$ is the lowest value. The three values are then combined to give a single figure of merit:

$$FM=(V_i-V_l)/V_h$$

This gives a classification value for each of the four class responses. Theoretically these values are as follows:

| | | |
|---|---|---|
| Class A: | 1:1:0 | FM = 1 |
| Class B: | 1:0.85:0.15 | FM = 0.7 |
| Class C: | 1:0.666:0.333 | FM = 0.333 |
| Class D: | 1:0.5:0.5 | FM = 0 |

Because actual values may deviate from these the control means is arranged to compare values using magnitudes in order to allocate the figure to the appropriate class. One way to allocate values is to move from one class to another at the point where the percentage difference between the two is equal, so

| | |
|---|---|
| If (FM > 0.82) | Result = Class A |
| If (FM <= 0.82) and (FM > 0.45) | Result = Class B |
| If (FM <= 0.45) and (FM > 0.16) | Result = Class C |
| If (FM <= 0.16) | Result = Class D |

In practice, though there are variations from the ideal in the FM values measured. Similar values cause the measured FM values to be lower than the ideal, while dissimilar windings cause them to be elevated. This can cause errors in determination, so a modified set of factors are used, as follows:

| | |
|---|---|
| If (FM > 0.82) | Result = Class A |
| If (FM <= 0.82) and (FM > 0.48) | Result = Class B |
| If (FM <= 0.48) and (FM > 0.16) | Result = Class C |
| If (FM <= 0.16) | Result = Class D |

When the three sets of results have been classified the configuration of the transformer is determined. By assigning values to each of the class results, the group of the transformer is determined by summing the result values for each class result. The constants are defined so that when three class results are summed, if they are the same, they cannot be confused with a different class result. In this embodiment the constants are defined as follows, although other definitions are possible.

| | |
|---|---|
| Class A = | 0x40 (64 decimal) |
| Class B = | 0x10 (16 decimal) |
| Class C = | 0x04 (4 decimal) |
| Class D = | 0x01 (1 decimal) |

So, summing the results for each of the possible groups gives the following results:

| | |
|---|---|
| Group 1 (D-D) = | (2 * 0x10) + 0x01 = 0x21 (33 decimal) |
| Group 2 (D-Y) = | (2 * 0x04) + 0x40 = 0x48 (72 decimal) |
| Group 3 (Y-D) = | (2 * 0x10) + 0x40 = 0x60 (96 decimal) |
| Group 4 (Y-Y) = | (2 * 0x04) + 0x01 = 0x09 (9 decimal) |

In other embodiments different methods of classification are used, for example the use of a neutral network.

Once the transformer group has been determined it is necessary to determine the presence of neutrals on the transformers, using the algorithm illustrated in FIG. 2. The transformer is energised using H1-H3, and X1-X3, X2-X1 and X3-X2, are measured. The highest value is saved as $X_{pp}$. The transformer is then energised using H1-H3 and X1-X0, X2-X0 and X3-X0 are measured. The highest value is saved as $X_{pn}$. The transformer is finally energised using H1-H0 and X1-X3, X2-X1 and X3-X2 are measured. The highest value is saved as $X_{np}$.

If Xpn/Xpp>0.25 the transformer has a neutral on the secondary

If Xnp/Xpp>0.25 the transformer has a neutral on the primary.

So there is enough information to determine the configuration of transformer:

| Transformer: | Prim. Neut. | Sec Neut. | Type |
|---|---|---|---|
| Group 1 | No | No | D-D (or D-Z or Z-D or Z-Z) |
| | No | Yes | D-Zn |
| | Yes | No | Zn-D (or Zn-Z) |
| | Yes | Yes | Zn-Zn |
| Group 2 | No | No | D-Y (or Z-Y) |
| | No | Yes | D-Yn (or Z-Yn) |
| | Yes | No | Zn-Y |
| | Yes | Yes | Zn-Yn |
| Group 3 | No | No | Y-D (or Y-Z) |
| | No | Yes | Y-Zn |
| | Yes | No | Yn-D (or Yn-Z) |
| | Yes | Yes | Yn-Zn |
| Group 4 | No | No | Y-Y |
| | No | Yes | Y-Yn |
| | Yes | No | Yn-Y |
| | Yes | Yes | Yn-Yn |

If the time taken to determine the configuration is critical, some of the measurements could be combined with the first stage of the determination process, though this would add complexity to the implementation of the system.

The final stage of the process is to determine the phase displacement of the transformer. The algorithm for this is also illustrated in the flow chart in FIG. 2. As discussed above, there are three stages to determining the phase displacement of the transformer. If the transformer has dissimilar windings an intrinsic 30-degree phase shift introduced. This adds one to the determined phase displacement.

Looking at the tables above showing how the basic displacement of the transformer is determined, we can arrange the results to give the same outputs for either class of transformer:

| Phase Shift Class 1 | | Phase Shift Class 2 | | Maximum/Minimum measured on Output Terminals: | | | | | |
|---|---|---|---|---|---|---|---|---|---|
| Energise | Link | Energise | Link | | | | | | |
| H2-H1 | H1-H3 | H3-H2 | H2-H1 | X1-X3 | X3-X2 | X2-X1 | X1-X2 | X2-X3 | X3-X1 |
| H3-H2 | H2-H1 | H1-H3 | H3-H2 | X2-X1 | X1-X3 | X3-X2 | X3-X1 | X1-X2 | X2-X3 |
| H1-H3 | H3-H2 | H2-H1 | H1-H3 | X3-X2 | X2-X1 | X1-X3 | X2-X3 | X3-X1 | X1-X2 |
| | | | | Rot = 0 | Rot = 4 | Rot = 8 | Rot = 0 Swapped | Rot = 4 Swapped | Rot = 8 Swapped |

So, depending on whether the transformer is class 1 or class 2 it is energised using the patterns above and the terminals on the secondary that give the minimum (class 1) or maximum (class 2). The leg results (highest or lowest leg) can be combined to give a net result for the transformer, by assigning a constant to them and summing the results:

| Energising Leg - Class 1 | Energising Leg - Class 2 | Leg Result: | Constant Applied |
|---|---|---|---|
| H2-H1 | H3-H2 | X1-X3 | 00000000B = 0x00 = 0 |
| | | X2-X1 | 00000001B = 0x01 = 1 |
| | | X3-X2 | 00000010B = 0x02 = 2 |
| H3-H2 | H1-H3 | X1-X3 | 00000000B = 0x00 = 0 |
| | | X2-X1 | 00000100B = 0x04 = 4 |
| | | X3-X2 | 00001000B = 0x08 = 8 |
| H1-H3 | H2-H1 | X1-X3 | 00000000B = 0x00 = 0 |
| | | X2-X1 | 00010000B = 0x10 = 16 |
| | | X3-X2 | 00100000B = 0x20 = 32 |

This gives six possible configuration results:

| Value | Phase rotation | X2 and X3 swapped |
|---|---|---|
| 0x24 = 36 | 0 | No |
| 0x12 = 18 | 4 | No |
| 0x09 = 9 | 8 | No |
| 0x21 = 33 | 0 | Yes |
| 0x06 = 6 | 4 | Yes |
| 0x18 = 24 | 8 | Yes |

The final stage is to determine if the windings are reversed. The transformer is energised phase to phase on the primary and the corresponding phase to phase measurement is made on the secondary. The phase shift of the secondary with respect to the primary is measured. If it is greater than 90 degrees or less than −90 degrees, the windings are reversed. The energisation and measurement phases are determined using the following table:

| Configuration Result | Energise | Measure |
|---|---|---|
| 0x24 = 36 | H1-H3 | X1-X3 |
| 0x12 = 18 | H1-H3 | X3-X2 |
| 0x09 = 9 | H1-H3 | X2-X1 |
| 0x21 = 33 | H1-H3 | X1-X2 |
| 0x06 = 6 | H1-H3 | X2-X3 |
| 0x18 = 24 | H1-H3 | X3-X1 |

The phase displacement is then be calculated using the following steps: Are the Primary and Secondary Windings Similar? (Stage 1)

| | |
|---|---|
| If Yes: | Phase Displacement = 0 |
| If No: | Phase Displacement = 1 |

What is the Configuration result factor? (Stage 2)

| | |
|---|---|
| 0x24 = 36: | Add 0 to Phase Displacement |
| 0x12 = 18: | Add 4 to Phase Displacement |
| 0x09 = 9: | Add 8 to Phase Displacement |
| 0x21 = 33: | Add 0 to Phase Displacement |
| 0x06 = 6: | Add 4 to Phase Displacement |
| 0x18 = 24: | Add 8 to Phase Displacement |

Are the secondary windings reversed? (Stage 3)

| | |
|---|---|
| If Yes: | Add 6 to the Phase Displacement |
| If No: | Add 0 to the Phase Displacement |

If the result is greater than 12, subtract 12 from the result.

The characteristics of the transformer being tested are now known and the apparatus can be arranged to measure the turns ratio for the transformer using a single phase power supply using a known method.

The above embodiment is described by way of example. Many variations are possible without departing from the scope of the following claims.

The invention claimed is:

1. A method of characterising a three phase transformer having three input terminals and three output terminals using a single phase power supply, the method comprising the steps of:

sequentially connecting the single phase power supply between all three available pairs of input terminals selected from the three input terminals of the transformer so as to energise each available pair of input terminals in turn;

during energisation of each pair of terminals measuring the voltage between all three available pairs of output terminals selected from the three output terminals of the transformer; and processing the measured voltages to determine therefrom which one of a plurality of winding configurations the transformer has in order to characterise the transformer even when its winding configuration is unknown.

2. A method as claimed in claim 1 wherein the measured voltages are processed to automatically characterise the transformer according to its winding configuration.

3. A method as claimed in claim 1, wherein the processing step further comprises classifying the transformer as D-D equivalent, D-Y equivalent, Y-D equivalent or Y-Y equivalent according to its winding configuration determined from the measured voltages.

4. A method as claimed in claim 1 wherein the transformer is characterised according to the presence of neutrals on its primary and/or secondary side.

5. A method of characterising a three phase transformer having three input terminals and three output terminals using a single phase power supply, the method comprising the steps of:
  sequentially connecting the single phase power supply between all three available pairs of input terminals selected from the three input terminals of the transformer so as to energise each available pair of input terminals in turn;
  during energisation of each pair of terminals measuring the voltage between all three available pairs of output terminals selected from the three output terminals of the transformer; and
  processing the measured voltages to characterise the transformer;
  wherein the three voltages measured during energisation of each pair of input terminals are processed to identify the highest, lowest and intermediate value and the difference between the intermediate value less the lowest value computed and then divided by the highest value to produce three figures of merit, one associated with energisation of each pair of input terminals.

6. A method as claimed in claim 5 wherein each figure of merit is classified into one of four classes according to its value.

7. A method as claimed in claim 6 wherein each figure of merit is classified in a first class if it is greater than 0.82, a second class if it is less than or equal to 0.82 but greater than 0.45, a third class if it is less than or equal to 0.45 but greater than 0.16 and a fourth class if it is less than or equal to 0.16.

8. A method as claimed in claim 6 wherein a value is allocated to each figure of merit according to its classification, the allocated values are then added, and the transformer classified as D-D equivalent, D-Y equivalent, Y-D equivalent or Y-Y equivalent according to the total.

9. A method as claimed in claim 8 wherein the first, second, third and fourth classes are allocated the decimal numbers 64, 16, 4 and 1 respectively, (or equivalent numbers in a different base) and the transformer classified as follows according to the total of the allocated values:

| Winding classification | Sum of values |
|---|---|
| D-D | 33 |
| D-Y | 72 |
| Y-D | 96 |
| Y-Y | 9 |

10. A method of characterising a three phase transformer having three input terminals and three output terminals using a single phase power supply, the method comprising the steps of:
  sequentially connecting the single phase power supply between all three available pairs of input terminals selected from the three input terminals of the transformer so as to energise each available pair of input terminals in turn;
  during energisation of each pair of terminals measuring the voltage between all three available pairs of output terminals selected from the three output terminals of the transformer; and
  processing the measured voltages to characterise the transformer;
  wherein the transformer is characterised according to the presence of neutrals on its primary and/or secondary side; and
  wherein the transformer has three input terminals H1, H2 and H3 and an input neutral terminal H0 and three output terminals X1, X2 and X3 and an output neutral X0 and when the single phase power supply is connected between input terminals H1 and H3 the highest voltage measured between output terminals X1 and X3, X2 and X1 and X3 and X2 is saved ($X_{pp}$) and the highest voltage measured between X1 and X0, X2 and X0 and X3 and X0 is saved ($X_{pp}$) and further comprising the step of connecting the single phase power supply between H1 and H0, measuring the voltages between X1 and X3, X2 and X1, and X3 and X2, saving the highest value ($X_{pn}$) and determining the ratios of the first saved voltage with each of the second and third saved voltages respectively ($X_{pn}/X_{pp}$ and $X_{np}/X_{pp}$) thereby to determine the presence of neutrals on the primary and/or secondary side of the transformer.

11. A method as claimed in claim 10 wherein the presence or absence of a neutrals is combined with the classification of winding configuration in order to further classify the winding configuration of the transformer as one of the following:
  a) D-D or D-Z or Z-D or Z-Z
  b) D-$Z_n$
  c) $Z_n$-D or $Z_n$-Z
  d) $Z_n$-$Z_n$
  e) D-Y or Z-Y
  f) D-$Y_n$ or Z-$Y_n$
  g) $Z_n$-Y
  h) $Z_n$-$Y_n$
  i) Y-D or Y-Z
  j) Y-$Z_n$
  k) $Y_n$-D or $Y_n$-Z
  l) $Y_n$-$Z_n$
  m) Y-Y
  n) Y-$Y_n$
  o) $Y_n$-Y
  p) $Y_n$-$Y_n$.

12. A method of characterising a three phase transformer having three input terminals and three output terminals using a single phase power supply, the method comprising the steps of:
  sequentially connecting the single phase power supply between all three available pairs of input terminals selected from the three input terminals of the transformer so as to energise each available pair of input terminals in turn;
  during energisation of each pair of terminals measuring the voltage between all three available pairs of output terminals selected from the three output terminals of the transformer; and
  processing the measured voltages to characterise the transformer, the measured voltages being processed to characterise the transformer according to its winding configuration, and the transformer is classified as D-D equivalent, D-Y equivalent, Y-D equivalent or Y-Y equivalent;

wherein the phase displacement of the transformer is calculated by the following steps:

determining if the primary and secondary winding configurations are similar and if not allocating a value of 1, otherwise allocating a value of 0;

determining a configuration result factor and adding a value according to the configuration result factor to the value allocated in the previous step;

determining if the secondary winding of the transformer windings is reversed and if not adding 6 to the value calculated in the previous step, otherwise leaving the value unaltered; and if the value is greater than 12 subtracting 12, otherwise leaving the value unaltered, thereby to determine the phase displacement of the transformer.

13. A method as claimed in claim 12 wherein the configuration result factor is determined as follows:

during energisation of each pair of input terminals shorting the remaining terminal to the low end of the energising power supply noting the pair of output terminals across which the lowest output is measured and allocating a value depending on at which pair of output terminals the lowest output is measured, said value also depending upon whether or not the primary and secondary winding configurations are similar or not and naming the three values allocated to obtain the configuration result factor.

14. A method according to claim 12 wherein to determine if the secondary windings of the transformer are reversed the transformer is energised phase to phase on the primary and a corresponding phase to phase measurement made on the secondary and measuring the phase shift and the primary with respect to the secondary.

15. Apparatus for characterising a three phase transformer comprising:

single phase power supply;

means for selectively applying power from said power supply to pairs of input terminals of a three phase transformer;

means for measuring the voltage between pairs of output terminals of a three phase transformer; and a control means comprising a processing means, said control means being operative to control said power supply, means for measuring voltages and processing means to process the measured voltages to determine which one of a plurality of winding configurations the transformer has thereby to characterise a transformer even when its winding configuration is unknown.

16. Apparatus as claimed in claim 15 further comprising a phase meter under control of the control means.

17. Apparatus as claimed in claim 15 wherein the control means comprises a programmed computer.

* * * * *